(12) United States Patent
England

(10) Patent No.: US 9,590,028 B2
(45) Date of Patent: Mar. 7, 2017

(54) METHOD AND DEVICE FOR AN INTEGRATED TRENCH CAPACITOR

(71) Applicant: GLOBALFOUNDRIES Inc., Grand Cayman (KY)

(72) Inventor: Luke England, Tervuren (BE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/948,587

(22) Filed: Nov. 23, 2015

(65) Prior Publication Data

US 2016/0079342 A1    Mar. 17, 2016

Related U.S. Application Data

(62) Division of application No. 14/155,886, filed on Jan. 15, 2014, now Pat. No. 9,257,383.

(51) Int. Cl.
| | | |
|---|---|---|
| *H01L 27/108* | (2006.01) | |
| *H01L 29/94* | (2006.01) | |
| *H01L 49/02* | (2006.01) | |
| *H01L 23/498* | (2006.01) | |
| *H01L 23/50* | (2006.01) | |
| *H01L 23/64* | (2006.01) | |

(52) U.S. Cl.
CPC ........ *H01L 28/60* (2013.01); *H01L 23/49827* (2013.01); *H01L 23/50* (2013.01); *H01L 23/642* (2013.01); *H01L 28/90* (2013.01); *H01L 2224/16225* (2013.01); *H01L 2924/15311* (2013.01)

(58) Field of Classification Search
None
See application file for complete search history.

(56) References Cited

U.S. PATENT DOCUMENTS 5,352,622 A    10/1994 Chung

*Primary Examiner* — Sonya D McCall Shepard
(74) *Attorney, Agent, or Firm* — Ditthavong & Steiner, P.C.

(57) ABSTRACT

A methodology for forming trench capacitors on an interposer wafer by an integrated process that provides high-capacitance, ultra-low profile capacitor structures and the resulting device are disclosed. Embodiments include forming a polymer block on a front side of an interposer wafer, patterning and etching the polymer block to form one or more trenches, and forming a capacitor on an upper surface of the polymer block and in the one or more trenches.

16 Claims, 9 Drawing Sheets

METHOD AND DEVICE FOR AN INTEGRATED TRENCH CAPACITOR

RELATED APPLICATION

The present application is a Divisional application of application Ser. No. 14/155,886, filed on Jan. 15, 2014, which is incorporated herein by reference in its entirety.

TECHNICAL FIELD

The present disclosure relates to design and integration of decoupling capacitors for an interposer process flow. The present disclosure is particularly applicable to 65 nanometer (nm) designs and beyond for through-silicon vias (TSV).

BACKGROUND

Many 2.5D applications utilize decoupling capacitors. For example, silicon (Si) interposers are implemented by embedding a thin-film parallel plate capacitor in the interposer routing. However, integrated capacitors take up valuable space that could otherwise be used for signal routing in a back-end-of-line (BEOL)/redistribution layer (RDL). An additional drawback is the low capacitance values of such designs. Another conventional method is to utilize capacitors (e.g., ceramic and Si surface mount capacitors) mounted on the surface of the wafer interposer. However, surface-mounted capacitors are typically large and take up valuable space on the surface of the interposer that could be used for die placement. In addition, surface-mounted capacitors must be square/rectangle shaped, which limits the placement of dies on the interposer.

A need therefore exists for a methodology enabling a BEOL/RDL process to fabricate a high-capacitance, low profile capacitor on an interposer surface and the resulting device.

SUMMARY

An aspect of the present disclosure is an integrated polymer trench capacitor on top of an interposer.

Another aspect of the present disclosure is a method of forming an integrated polymer trench capacitor on top of an interposer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a polymer block on a front side of an interposer wafer; patterning and etching the polymer block to form one or more trenches, and forming a capacitor on an upper surface of the polymer block and in the one or more trenches.

Aspects of the present disclosure include forming the capacitor by conformally forming a first metal layer in the one or more trenches, upper and side surfaces of the polymer block, an exposed surface of the interposer wafer, and a connection pad formed on the interposer wafer; and removing the first metal layer from the exposed surface of the interposer wafer, the connection pad, and the side surfaces of the polymer block. Further aspects include pulling the first metal layer back from outer edges of the polymer block. Additional aspects include conformally forming a dielectric layer on the exposed surface of the interposer wafer, the connection pad, the side surfaces of the polymer block, and the first metal layer; and removing the dielectric layer from the exposed surface of the interposer wafer and the connection pad. Other aspects include forming a second metal layer on the exposed surface of the interposer wafer, the connection pad, and the dielectric layer; and removing the second metal layer from the exposed surface of the interposer wafer. Additional aspects include forming a polymer layer on the front side of the interposer wafer; and patterning and etching the polymer layer to form the polymer block at one or more connection pads on the interposer wafer. Another aspect includes the one or more trenches having one or more holes or one or more troughs in the polymer block. Further aspects include the one or more trenches having an aspect ratio of 1:20 to 1:25. Other aspects include the polymer layer being formed to a thickness of up to 100 micrometers (μm).

Another aspect of the present disclosure is a device including a polymer block on a front surface of an interposer wafer and a capacitor formed on an upper surface of and in one or more trenches in the polymer block. Additional aspects include the capacitor including a first metal layer in the one or more trenches and on the upper surface of the polymer block. Further aspects include the first metal layer being pulled back from outer edges of the polymer block. Other aspects include a dielectric layer on the first metal layer and side surfaces of the polymer block. Another aspect includes a connection pad on the interposer wafer; and a second metal layer on the connection pad and on the dielectric layer. Further aspects include the one or more trenches having one or more holes or one or more troughs in the polymer block. Other aspects include the one or more trenches having an aspect ratio of 1:20 to 1:25. Additional aspects include the polymer layer being formed to a thickness of up to 100 μm.

Aspects include a method including: forming a polymer layer on a front side of an interposer wafer; patterning and etching the polymer layer to form a polymer block at one or more connection pads on the interposer wafer; patterning and etching the polymer block to form one or more trenches; conformally forming a first metal layer in the one or more trenches, upper and side surfaces of the polymer block, an exposed surface of the interposer wafer, and one of the one or more connection pads; removing the first metal layer from the exposed surface of the interposer wafer, the one of the one or more connection pads, and the side surfaces of the polymer block; pulling the first metal layer back from outer edges of the polymer block; conformally forming a dielectric layer on the exposed surface of the interposer wafer, the one of the one or more connection pads, the side surfaces of the polymer block, and the first metal layer; removing the dielectric layer from the exposed surface of the interposer wafer and the one of the one or more connection pads; forming a second metal layer on the exposed surface of the interposer wafer, the one of the one or more connection pads, and the dielectric layer; and removing the second metal layer from the exposed surface of the interposer wafer. Additional aspects include the one or more trenches having one or more holes or one or more troughs in the polymer block. Further aspects include the one or more trenches having an aspect ratio of 1:20 to 1:25.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of inefficient use of space on an interposer wafer attendant upon employing surface-mounted capacitors. The present disclosure also addresses and solves the current problems of poor capacitance and poor use of routing resources attendant upon BEOL/RDL integrated capacitors. In accordance with embodiments of the present disclosure, a polymer trench capacitor is integrated on top of an interposer.

Methodology in accordance with embodiments of the present disclosure includes forming a polymer block on a front side of an interposer wafer, patterning and etching the polymer block to form one or more trenches, and forming a capacitor on an upper surface of the polymer block and in the one or more trenches.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
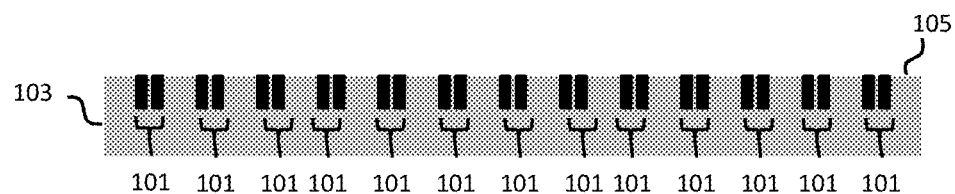
FIGS. 1A through 1F schematically illustrate a high level process flow, in accordance with an exemplary embodiment of the present disclosure.

FIGS. 1A through 1F schematically illustrate a high level process flow, in accordance with an exemplary embodiment of the present disclosure. FIG. 1A illustrates TSVs 101 formed in a Si interposer wafer 103. Holes (not shown for illustrative convenience) may be formed in the Si interposer wafer 103, lined with a dielectric insulator (not shown for illustrative convenience), and filled with metal.

Figure 1B:
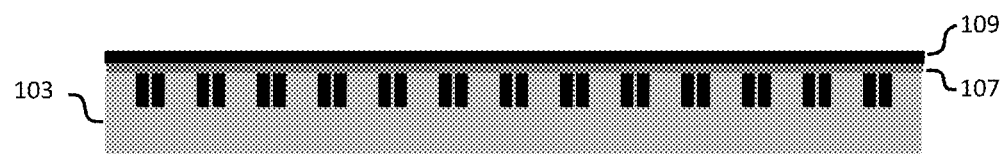
Figure 1C:
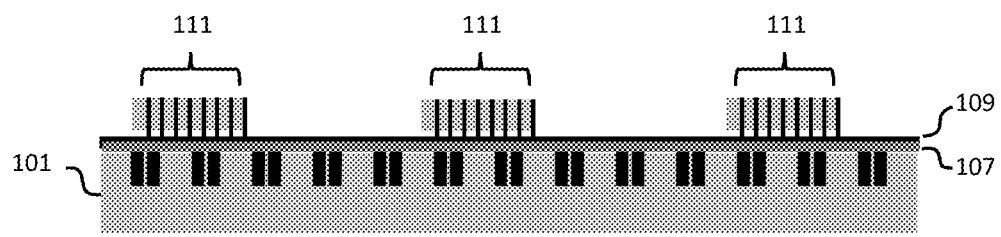

FIG. 1B illustrates the Si interposer wafer 103 after a BEOL interconnect process. A BEOL routing layer 107 is formed on the upper surface 105, connected to the TSVs 101, and a top inorganic dielectric layer 109 that serves as a base surface for polymer block formation may be formed on the BEOL routing layer 107. The inorganic dielectric layer 109 may be deposited using a chemical vapor deposition (CVD) process to deposit roughly 0.5 µm of an oxide or nitride (e.g., silicon oxide ($SiO_2$), silicon nitride (SiN)). A dielectric chemical-mechanical-polishing (CMP) process may then be used to planarize the inorganic dielectric layer 109, followed by etching via openings into the dielectric layer 109 for connection to the BEOL routing layer 107. Adverting to FIG. 1C, trench capacitors 111 are formed on the inorganic dielectric layer 109.

Figure 1D:
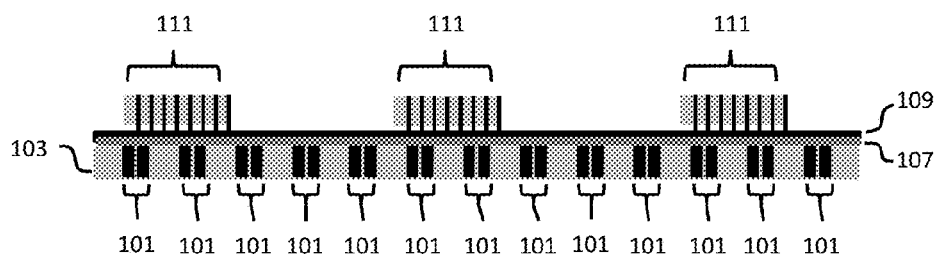

Adverting to FIG. 1D, a backside processing is conducted. The Si interposer wafer 103 may be prepared by a back-grind process to uniformly remove Si to reveal the TSVs 101. The TSVs 101 are revealed using a combination of wet and dry etch processes to remove any remaining Si and exposed inorganic TSV dielectric liner (not shown for illustrative convenience).

Figure 1E:
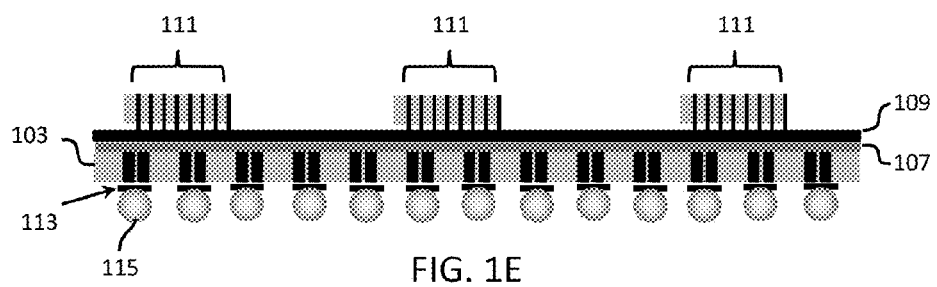
Figure 1F:
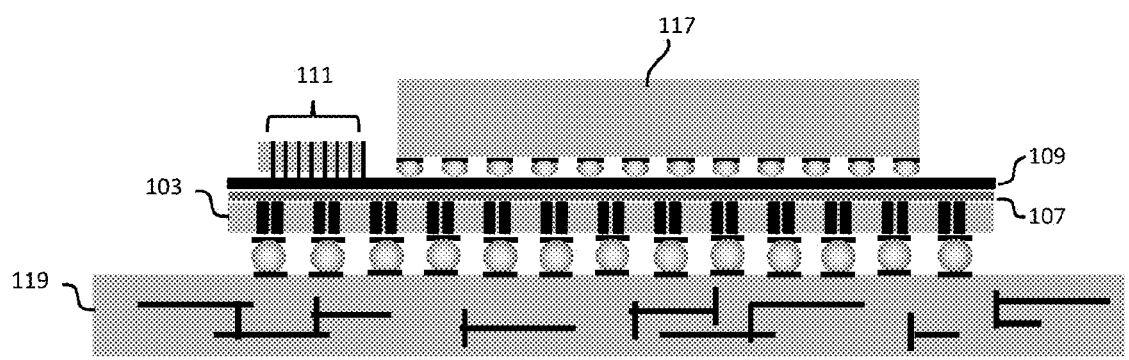

Adverting to FIG. 1E, standard lithography and electroplating processes may then be used to form the under bump metallurgy (UBM) 113 and solder connection 115. FIG. 1F illustrates a backend assembly process whereby a die 117 is placed on the Si interposer wafer 103. Also illustrated is the organic BGA package substrate 119 that the interposer is attached to. The trench capacitor 111 supplies the required capacitance while utilizing a small portion of the interposer's surface.

Figure 2A:
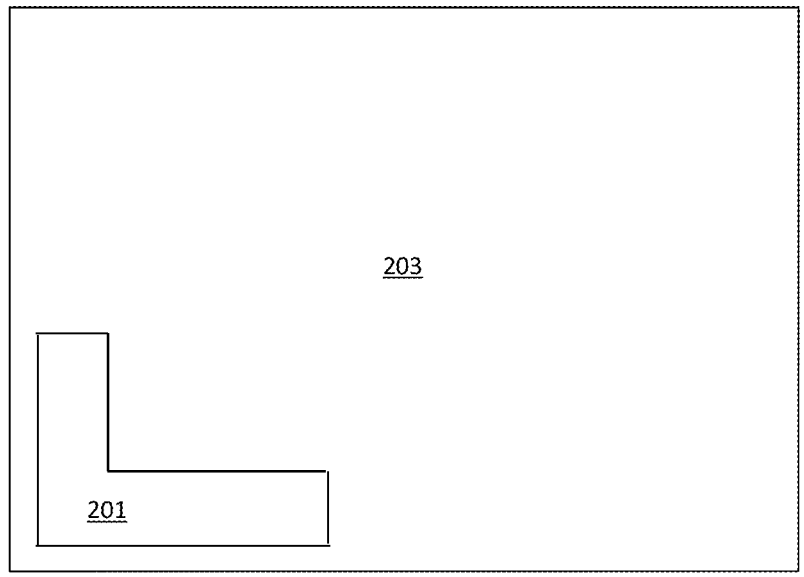
FIGS. 2A and 2B schematically illustrate a shape of a trench capacitor, in accordance with an exemplary embodiment of the present disclosure.
Figure 2B:
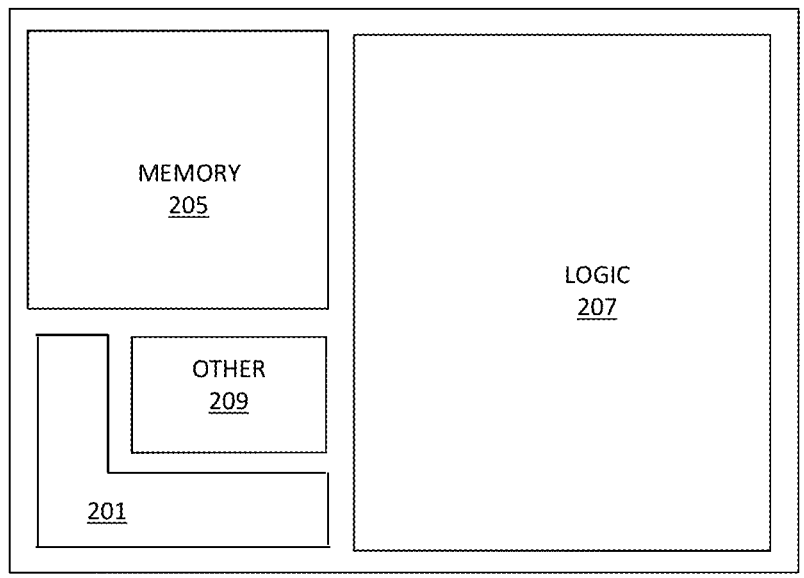

FIGS. 2A and 2B schematically illustrate a shape of a trench capacitor, in accordance with an exemplary embodiment of the present disclosure. FIG. 2A illustrates an L-shaped trench capacitor 201 formed on the interposer 203. A trench capacitor may take any shape in order to fully use any leftover area on the interposer. For instance, FIG. 2B illustrates the interposer after die placement. For example, a memory die 205, logic die 207, and other die 209 fit in and around the space of the L-shaped trench capacitor 201. As described in greater detail with respect to FIGS. 5A through 5H, a trench capacitor (e.g., trench capacitor 201) may be formed by spin coating a thick polymer layer on an interposer wafer (e.g., interposer 203) and then photo defining the polymer to form trench-shaped capacitor structures. For instance, a trench capacitor may be formed by a series of metal and dielectric layer depositions and etches to fill the trenches. Individual dies (e.g., memory die 205, logic die 207, etc.) may be flip-chip dies attached to the interposer 203.

Figure 3A:
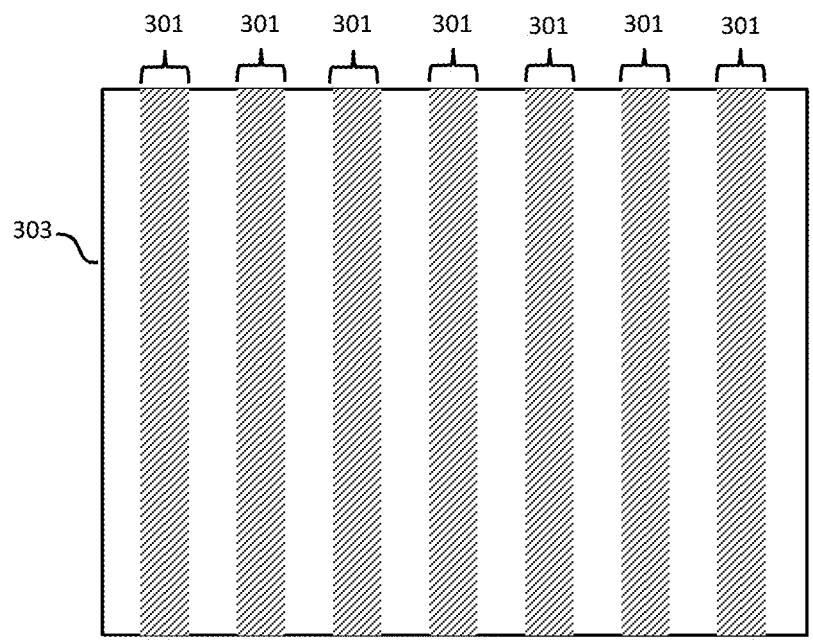
FIGS. 3A and 3B schematically illustrate a fin or trough configuration of a trench capacitor, in accordance with an exemplary embodiment of the present disclosure.
Figure 3B:
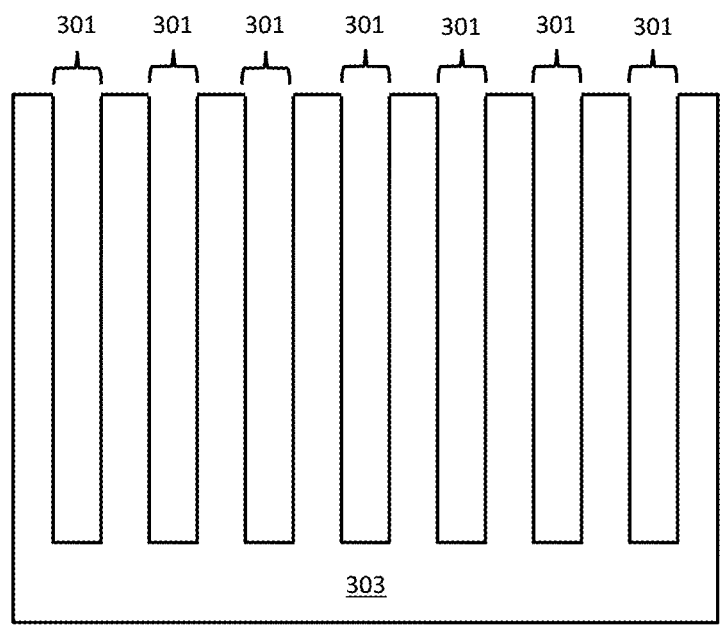

FIGS. 3A and 3B schematically illustrate a fin array configuration of a trench capacitor, in accordance with an exemplary embodiment of the present disclosure. FIG. 3A illustrates a top view of a fin configuration for a trench capacitor. As shown, the trenches form equally spaced, parallel troughs 301. The trenches may be defined in a thick polymer layer 303 by a photolithographic process. FIG. 3B illustrates a cross-section view of the fin configuration. As shown, the troughs 301 are equally spaced and formed to a uniform depth in the polymer layer 303.

Figure 4A:
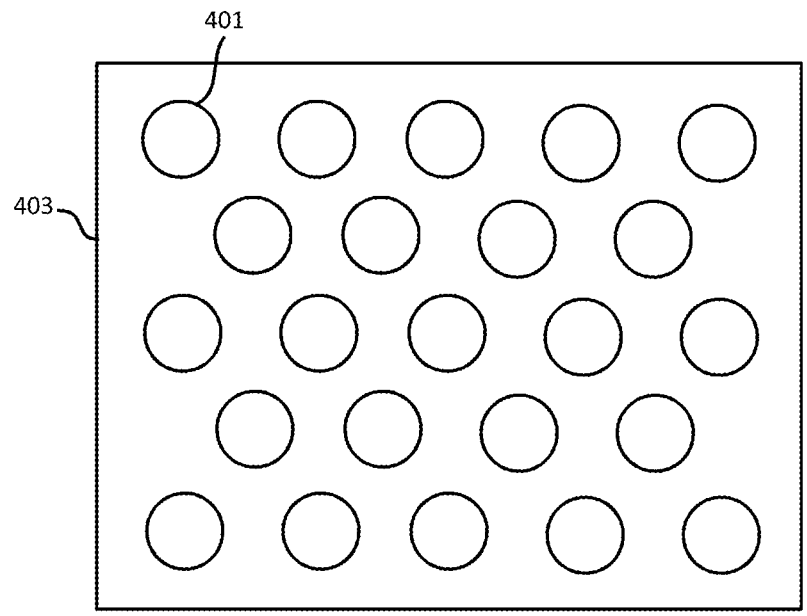
FIGS. 4A and 4B schematically illustrate a hole configuration of a trench capacitor, in accordance with an exemplary embodiment of the present disclosure.
Figure 4B:
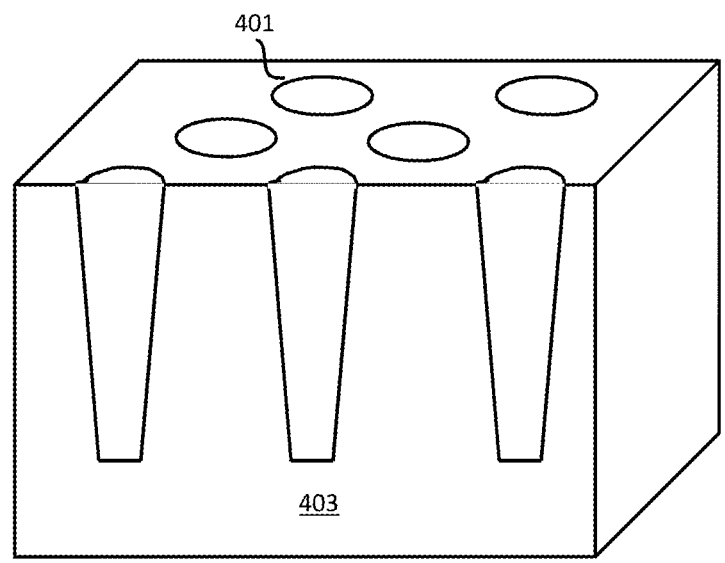

FIGS. 4A and 4B schematically illustrate a hole array configuration of a trench capacitor, in accordance with an exemplary embodiment of the present disclosure. FIG. 4A illustrates a top view of a hole array configuration for a trench capacitor. As shown, the trenches are formed as circular holes (e.g., hole 401) of roughly equal diameter in a polymer layer 403. FIG. 4B illustrates a cross-section view of the hole array configuration. As shown, the holes may be spaced at regular intervals in the polymer layer 403 and formed to a uniform depth. It is contemplated that other variations on these basic trench shape configurations may be used to form trenches.

Figure 5A:
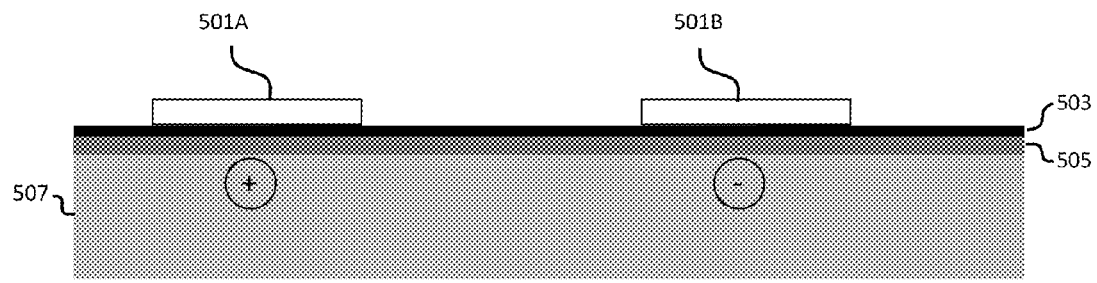
FIGS. 5A through 5H schematically illustrate a detailed process flow, in accordance with an exemplary embodiment of the present disclosure.

FIGS. 5A through 5H schematically illustrate a detailed process flow, in accordance with an exemplary embodiment of the present disclosure. FIG. 5A illustrates UBM pads 501A and 501B (collectively referred to as UBM pads 501), an inorganic dielectric layer 503, and a BEOL routing layer 505 formed on a Si interposer wafer 507. Not included in FIG. 5A for drawing simplicity are via connections from the bottom of the UBM pads 501, through the top inorganic dielectric layer 503, to the underlying BEOL routing layer 505 of the Si interposer wafer 507. A typical metal stack for the UBM pads 501A and 501B may include a gold (Au) layer on top of a 2 μm nickel (Ni) layer and a 2 μm copper (Cu) layer. Alternatively, several other metal stacks are possible.

Figure 5B:
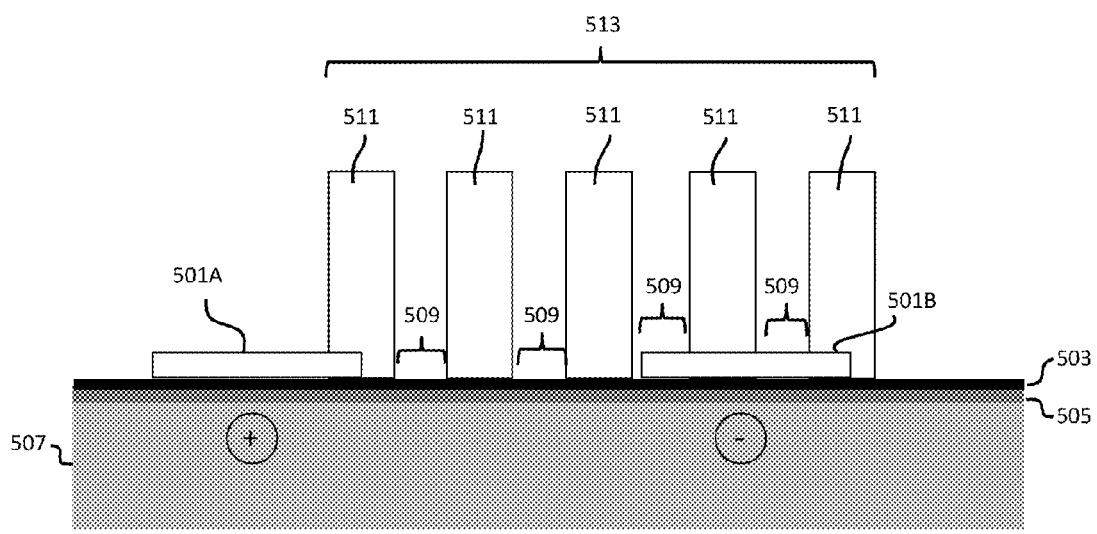

Adverting to FIG. 5B, one or more trenches 509 are formed from a polymer block material 511 deposited on the Si interposer wafer 507. The trenches 509 may be formed by spin coating a thick polymer (e.g., SU-8) layer on the Si interposer wafer 507 followed by a photo defining step. As shown, each trench thus formed includes sidewalls and a bottom surface. The trenches 509 may be of various shapes (e.g., fin, hole) and patterns and their aspect ratio may range from 1:20 to 1:25, depending on the polymer material that was used. For instance, a polymer layer that is 100 μm thick may be used to create trenches with width 5 μm. Trenches with aspect ratios less than 1:20 may also be utilized. Typically, if the sidewalls are steep, the process for forming a capacitor within the trenches becomes challenging. By increasing the slope of the sidewalls, this process may be made easier, which can be achieved by adjusting photolithography parameters.

As further illustrated in FIG. 5B, the polymer trench array 513 may be formed to completely cover ground (−) UBM pad 501B, while only partially covering the power (+) UBM pad 501A. This is required to facilitate electrical connection to the final capacitor structure. Of course, the power (+) and ground (−) UBM pads can also be switched in the configuration, where the polymer trench array 513 completely covers the positive (+) UBM pad 501A and partially covers the ground (−) UBM pad 501B.

Figure 5C:
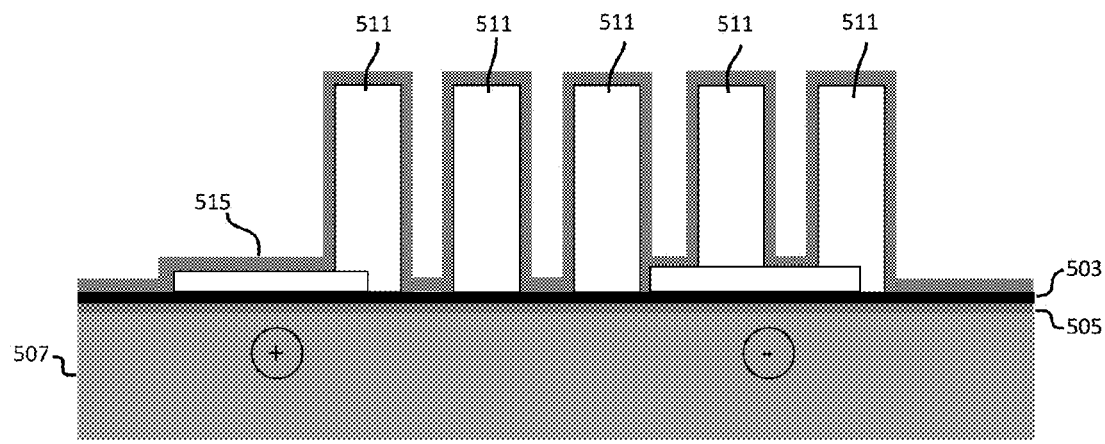

Adverting to FIG. 5C, a metal layer 515 is conformally formed in the trenches and on the interposer. The metal layer 515 may be formed of Cu or aluminum (Al) and have a thickness of 100 to 500 nm. The metal layer 515 may be deposited over a thin adhesion layer, such as titanium (Ti) (not shown for illustrative convenience).

Figure 5D:
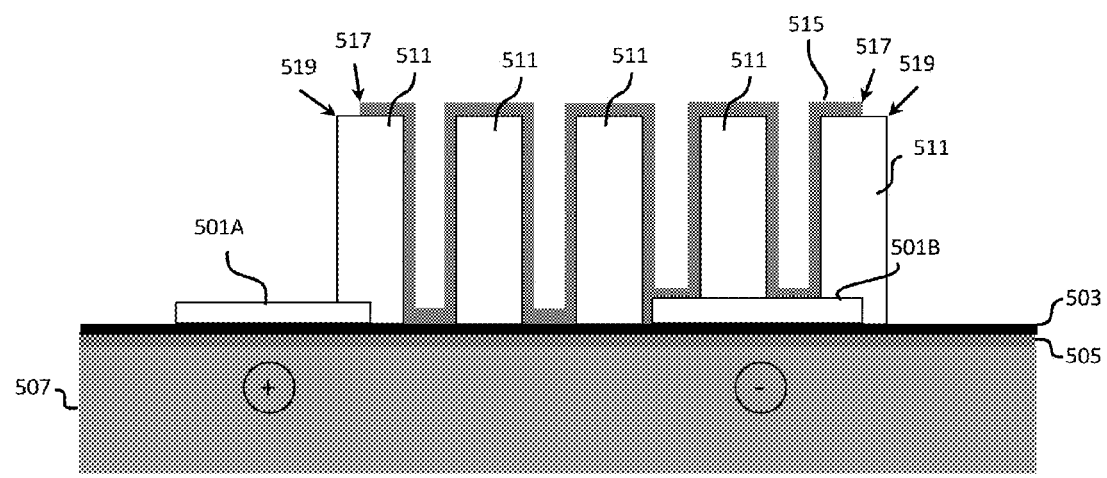

Adverting to FIG. 5D, the metal layer 515 is patterned using a photomask and wet etched to remove the metal from all surfaces except on those surfaces of the polymer material 511 and the ground (−) UBM pad 501B that will be used to form a capacitor. As shown, the edges 517 of the metal layer 515 have been pulled back from the top edges 519 of the capacitor. The amount of pull-back may depend on the manufacturing tolerance. For a trench width of 20 μm, the metal may be pulled back by approximately 50%, or 10 μm. The amount of pullback may be a smaller proportion of the trench width depending on manufacturing tolerances.

Figure 5E:
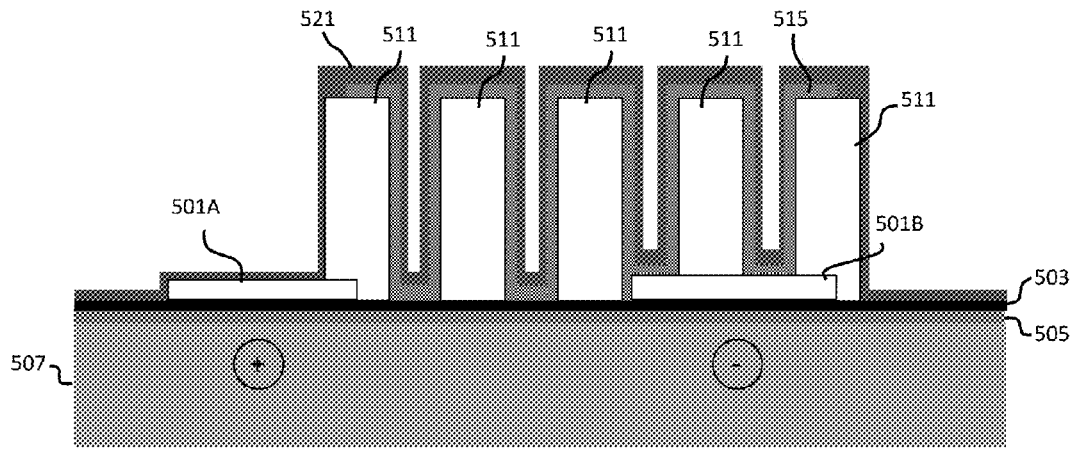

Adverting to FIG. 5E, a dielectric layer 521 is conformally deposited on all exposed surfaces. The dielectric layer 521 may be formed from $SiO_2$ or SiN and have a thickness from 50 to 250 nm. Alternatively, high-k dielectrics may also be used, including hafnium (Hf) or zirconium (Zr)-based dielectrics. A plasma-enhanced chemical vapor deposition (PE-CVD) process or a plasma-enhanced atomic layer deposition (PE-ALD) process may be used for the deposition.

Figure 5F:
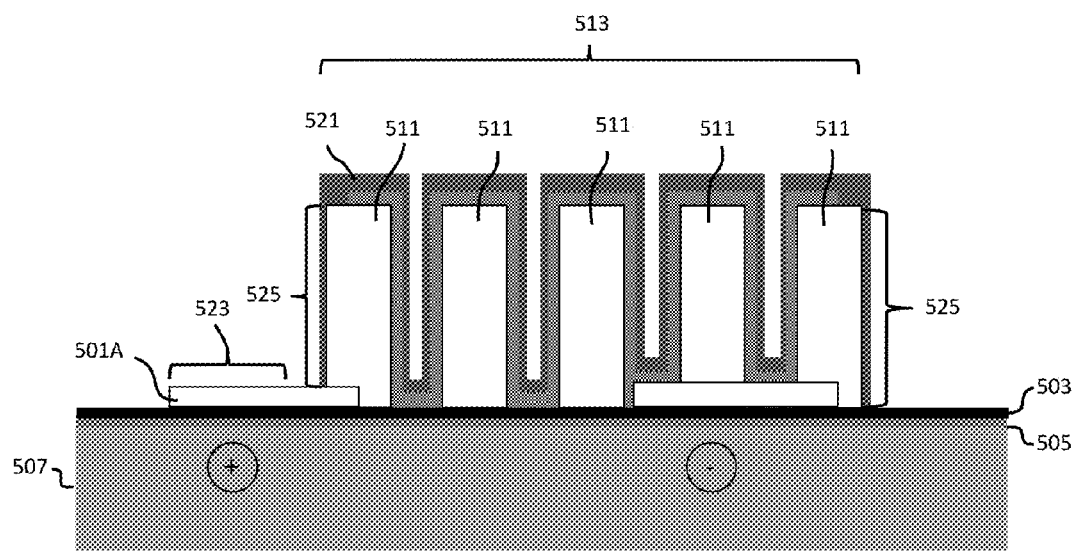

Adverting to FIG. 5F, the dielectric layer 521 is patterned and etched to remove it from all surfaces except the portion of the polymer material 511 that will be used to form the capacitor. For example, a photo mask and a dry etch process may be used for this step. As shown, the dielectric layer 521 is removed from the Si interposer wafer 507 and the exposed surface 523 of one of the UBM pads (e.g., UBM pad 501A). The dielectric layer 521 may remain on the outer sidewalls 525 of the polymer trench array 513 due to the directional nature of the etch process.

Figure 5G:
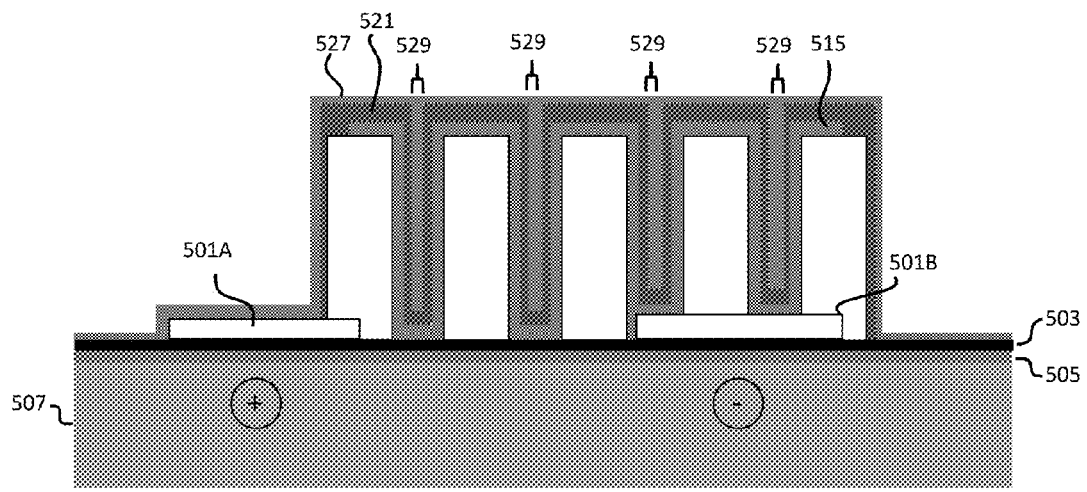

Adverting to FIG. 5G, another metal layer 527 is formed over the dielectric layer 521 and the exposed surfaces of the Si interposer wafer 507. For instance, Cu may be deposited by a sputtering process. The metal layer 527 may be used to form a power portion for the capacitor, as it is connected to the power UBM pad 501A. The thickness of the metal layer 527 may match that of the metal layer 515 (e.g., 100 to 500 nm) and also be formed of the same material (e.g., Cu). As shown, the metal layer 527 may be formed to fill the trenches 529. Alternatively, the metal layer 527 may be conformally formed.

Figure 5H:
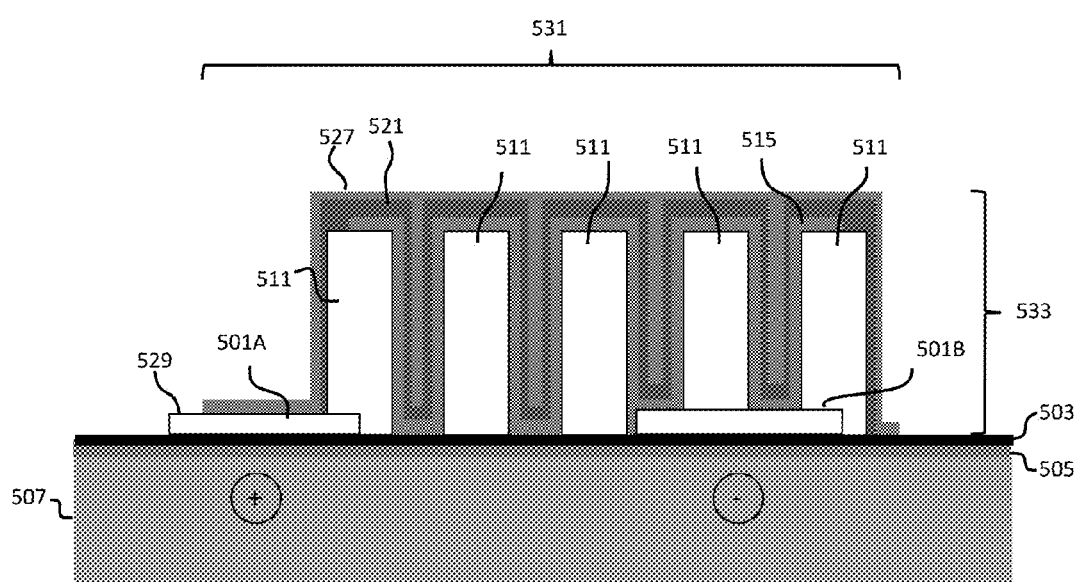

Adverting to FIG. 5H, the metal layer 527 is removed from the Si interposer wafer 507 to form the trench capacitor 531. As shown, the metal layer 527 may be removed in all locations except on the areas corresponding to the trench capacitor 531 and the UBM pads 501. The removal may be performed by a photo-mask patterning and dry etch process. As shown, the metal layer 515 (ground) is now connected to the Si interposer wafer 507 at UBM pad 501B and the metal layer 527 (power) is connected to the Si interposer wafer 507 at UBM pad 501A. The UBM pads 501 serve as the positive and negative (power and ground) terminals of the trench capacitor 531. The positive and negative polarity metal planes are isolated from each other by the intervening dielectric layer 521 and the polymer material 511. Thus formed, the trench capacitor has an ultra-low profile as measured by its height 533 when compared to conventional surface-mount capacitors. In addition, the trench capacitor 531 has a significantly (approximately 7 to 10 times) higher capacitance density per unit area than an equivalent parallel plate capacitor. As the capacitance varies with the surface area, the amount of capacitance may be increased by increasing the number of trenches within a given unit surface area.

The embodiments of the present disclosure can achieve several technical effects, including a trench capacitor with high capacitance, ultra-low profile, and a process of fabrication that can be easily integrated into existing processes. The present disclosure enjoys industrial applicability in any of 2.5D applications, including 65 nm designs and beyond for TSV interposers.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
a polymer block on a front surface of an interposer wafer;
a capacitor formed on an upper surface of and in one or more trenches in the polymer block;
a first metal layer in the one or more trenches and on the upper surface of the polymer block; and
a dielectric layer on the first metal layer and side surfaces of the polymer block.

2. The device according to claim 1, wherein the first metal layer is pulled back from outer edges of the polymer block.

3. The device according to claim 2, further comprising:
a connection pad on the interposer wafer; and
a second metal layer on the connection pad and on the dielectric layer.

4. The device according to claim 1, wherein the one or more trenches comprise one or more holes or one or more troughs in the polymer block.

5. The device according to claim 1, wherein the one or more trenches have an aspect ratio of 1:20 to 1:25.

6. The device according to claim 1, wherein the polymer layer is formed to a thickness of up to 100 micrometers ($\mu$m).

7. The device according to claim 3, wherein the first and second metal layers each have a thickness of 100 to 500 nm.

8. The device according to claim 7, wherein the first and second metal layers comprise copper (Cu) or aluminum (Al).

9. A device comprising:
a polymer block on a front surface of an interposer wafer;
a first metal layer formed in one or more trenches in the polymer block;
a dielectric layer formed over the first metal layer; and
a capacitor formed on an upper surface of and in the one or more trenches,
wherein the first metal layer is pulled back from outer edges of the polymer block, and
wherein the dielectric layer is formed on the first metal layer and side surfaces of the polymer block.

10. The device according to claim 9, further comprising:
a connection pad on the interposer wafer; and
a second metal layer on the connection pad and on the dielectric layer.

11. The device according to claim 9, wherein the one or more trenches comprise one or more holes or one or more troughs in the polymer block.

12. The device according to claim 9, wherein the one or more trenches have an aspect ratio of 1:20 to 1:25.

13. The device according to claim 9, wherein the polymer layer is formed to a thickness of up to 100 micrometers ($\mu$m).

14. The device according to claim 10, wherein the first and second metal layers each have a thickness of 100 to 500 nm.

15. The device according to claim 14, wherein the first and second metal layers comprise copper (Cu) or aluminum (Al).

16. A device comprising:
a polymer block on a front surface of an interposer wafer;
a connection pad on the interposer wafer;
a first metal layer formed in trenches in the polymer block;
a dielectric layer formed over the first metal layer;
a second metal layer on the connection pad and on the dielectric layer; and
a capacitor formed on an upper surface of and in the trenches of the polymer block,
wherein the trenches have an aspect ratio of 1:20 to 1:25, and
wherein the first metal layer is pulled back from outer edges of the polymer block.

* * * * *